(12) United States Patent
Hanazaki et al.

(10) Patent No.: US 8,349,525 B2
(45) Date of Patent: Jan. 8, 2013

(54) PROTECTIVE APPARATUS, MASK, MASK FABRICATING METHOD AND CONVEYING APPARATUS, AND EXPOSURE APPARATUS

(75) Inventors: Noritsugu Hanazaki, Funabashi (JP); Akinori Shirato, Sagamihara (JP)

(73) Assignee: Nikon Corporation, Tokyo (JP)

( * ) Notice: Subject to any disclaimer, the term of this patent is extended or adjusted under 35 U.S.C. 154(b) by 158 days.

(21) Appl. No.: 12/766,621

(22) Filed: Apr. 23, 2010

(65) Prior Publication Data
US 2010/0323302 A1    Dec. 23, 2010

Related U.S. Application Data

(60) Provisional application No. 61/213,538, filed on Jun. 18, 2009.

(51) Int. Cl.
*G03F 1/62* (2012.01)
(52) U.S. Cl. .......................................... 430/5
(58) Field of Classification Search ........ 430/5; 428/14; 355/30
See application file for complete search history.

(56) References Cited

U.S. PATENT DOCUMENTS

| | | | |
|---|---|---|---|
| 2005/0280789 A1 | 12/2005 | Bruls et al. | |
| 2008/0213679 A1 | 9/2008 | Miyakawa et al. | |
| 2009/0029268 A1 | 1/2009 | Lin et al. | |
| 2010/0310973 A1 * | 12/2010 | Matsushita | 430/5 |

FOREIGN PATENT DOCUMENTS

| | | |
|---|---|---|
| JP | 2002-049145 | 2/2002 |
| JP | 2002-296763 | 10/2002 |
| WO | WO 2005/029183 A2 | 3/2005 |
| WO | PCT/JP2010/060321 | 6/2010 |

* cited by examiner

*Primary Examiner* — Stephen Rosasco
(74) *Attorney, Agent, or Firm* — Finnegan, Henderson, Farabow, Garrett & Dunner, L.L.P.

(57) ABSTRACT

A protective apparatus that protects a predetermined area of the front surface of a mask substrate, provided with a pellicle frame that is disposed on at least a portion of the circumference of the predetermined area and bonded to the front surface of the mask substrate, and a pellicle that is mounted on the pellicle frame so as to cover an opening portion that is formed by the pellicle frame in a manner facing the predetermined area; in which the pellicle frame includes a first side portion and a second side portion, and a third side portion and a fourth side portion that are disposed at different positions along the predetermined area, and in relation to the normal direction of the front surface of the mask substrate, the rigidity of the first side portion and the second side portion is lower than the rigidity of the third side portion and the fourth side portion.

20 Claims, 8 Drawing Sheets

PROTECTIVE APPARATUS, MASK, MASK FABRICATING METHOD AND CONVEYING APPARATUS, AND EXPOSURE APPARATUS

CROSS-REFERENCE TO RELATED APPLICATION

This application is a non-provisional application claiming priority to and the benefit of U.S. provisional application No. 61/213,538, filed Jun. 18, 2009. The entire contents of which are incorporated herein by reference.

BACKGROUND

1. Field of the Invention

The present invention relates to a protective apparatus of a substrate, a mask that is provided with the protective apparatus, exposing art that uses this mask and device fabricating art.

2. Description of Related Art

In the photolithography process for fabricating an electronic device or the like, an exposure apparatus is used that illuminates a mask with exposure light, and exposes a photosensitive substrate with the exposure light from the mask. The mask is provided with a mask substrate (mask blank) and a protective apparatus that protects the pattern area in order to prevent foreign matter from adhering to the pattern area on the front surface of the mask substrate. The protective apparatus is provided with a pellicle frame that is installed on the mask substrate, and a pellicle that consists of, for example, a transparent, polymer film that is mounted on the pellicle frame (for example, refer to Japanese Unexamined Patent Application Publication No. 2002-296763).

In a conventional mask, when the mask substrate sags under its own weight, sagging occurs in the pellicle of the protective apparatus in correspondence. Recently, as mask substrates have increased in size, the sag amount of the mask substrate, and by extension the sag amount of the pellicle, has increased in accordance with the size of the mask substrate. When the sag amount of the pellicle increases in this way, for example in the case of irradiating detection light on the surface of the pellicle to detect the surface state thereof (for example, the presence of foreign matter), depending on the position on the pellicle, the irradiation condition of the detection light and the detection condition thereof change, leading to the risk of misdetection.

An aspect of the present invention has as its object to provide a protective apparatus and mask that are capable of suppressing sagging of the protective film such as a pellicle, and manufacturing art and conveying art of that mask. Also, an aspect of the present invention has as its object to provide exposing art and device manufacturing art using that mask.

SUMMARY

According to a first aspect of the present invention, a protective apparatus is provided that protects a predetermined area of the front surface of a substrate, including a support mechanism that is disposed on at least a portion of the circumference of the predetermined area and is bonded to the front surface of the substrate; and a protective film that is mounted on the support mechanism so as to cover an opening portion that is formed by the support mechanism in a manner facing the predetermined area, in which the support mechanism includes a plurality of first portions and second portions that are disposed at different positions along the predetermined area, and in relation to the normal direction of the front surface of the substrate, the rigidity of the first portions is lower than the rigidity of the second portions.

Also, according to a second aspect of the present invention, a mask is provided in which is provided with a substrate in which a predetermined area is provided on the front surface and the protective apparatus of the first aspect of the present invention is provided on the front surface of the substrate so as to cover the predetermined area.

Also, according to a third aspect of the present invention, a mask fabricating method is provided in which the protective apparatus of the first aspect of the present invention is bonded to the front surface of the substrate so as to cover the predetermined area of the front surface of the substrate, the method including: a process that places a adhesive agent between the support mechanism of the protective apparatus and the front surface of the substrate; and a process that biases the support mechanism to the front surface of the substrate via the adhesive agent while supplementing the rigidity of the first portions of the support mechanism.

Also, according to a fourth aspect of the present invention, an exposure apparatus is provided that exposes an object with exposure light via a mask and a projection optical system, using the mask according to the second aspect of the present invention as the mask.

Also, according to a fifth aspect of the present invention, a device fabricating method is provided that includes transferring to an object a pattern that is provided on the mask according to the second aspect of the present invention and processing the object to which the pattern has been transferred.

Also, according to a sixth aspect of the present invention, a mask conveying apparatus is provided, being provided with a support portion that supports a mask in which the protective apparatus according to the first aspect of the present invention is provided, and a drive apparatus that drives the support portion that supports the mask, in which the support portion supports a portion in the vicinity of the second portion among the front surface of the substrate.

According to the aspect of the present invention, when a substrate that is the subject of protection sags, since the first portion with a low rigidity in the support mechanism sags more than the second portion, the sag of the protective film is suppressed. Also, even if the substrate that is the subject of protection is increased in size, and the sag amount of that substrate increases, the sag of the protective film is suppressed.

DESCRIPTION OF EMBODIMENTS

<First Embodiment>

Hereinbelow, a first embodiment of the present invention shall be described with reference to FIG. 1 to FIG. 4. Hereinbelow, the description shall be given using the orthogonal coordinate system (X, Y, Z) set as follows. That is, the X axis and the Y axis are taken to be perpendicular within a plane that is parallel to the horizontal plane, and the Z axis is taken vertically upward perpendicular to that plane.

Figure 1:
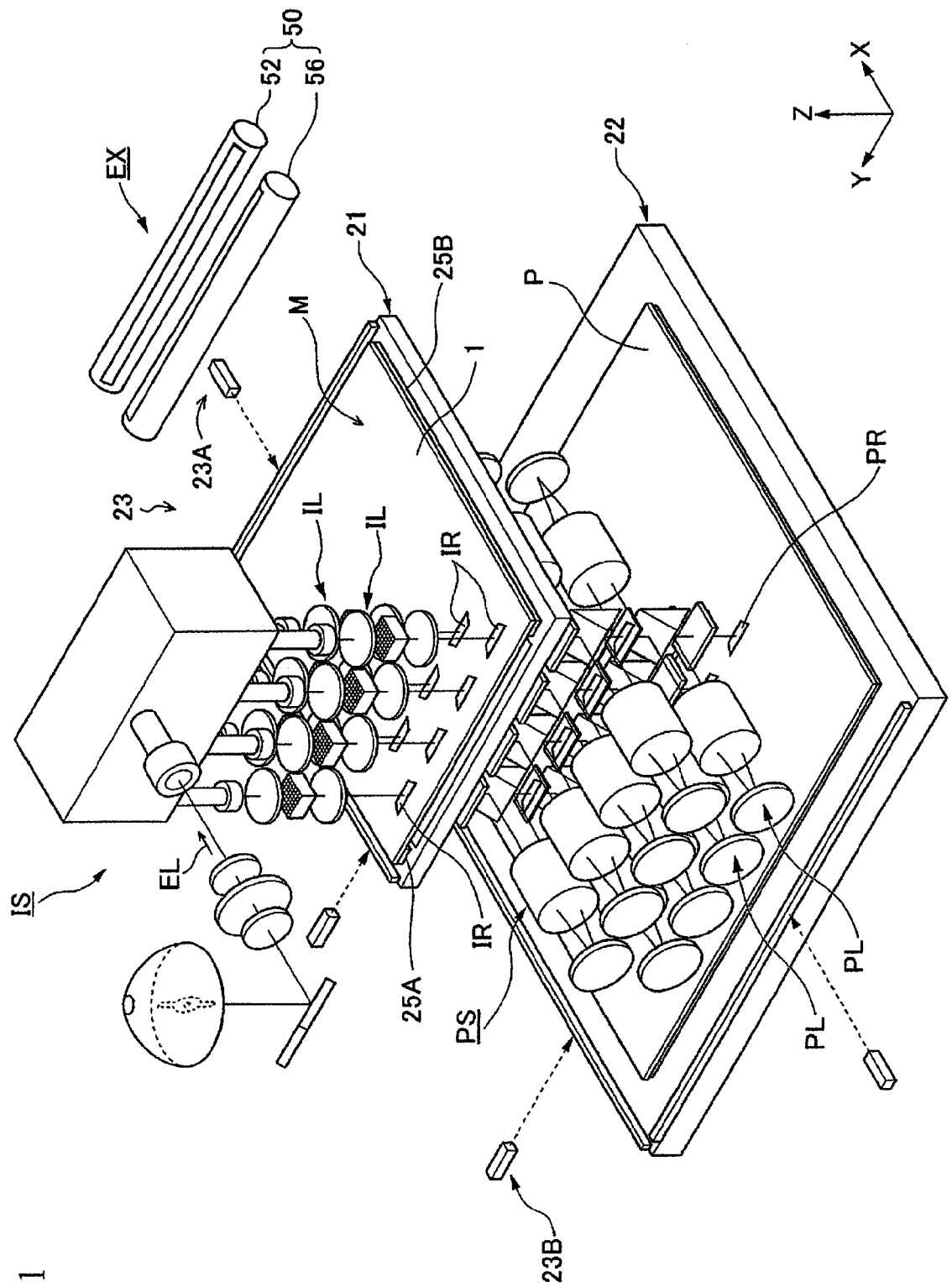
FIG. 1 is a perspective view that shows the exposure apparatus of the first embodiment.

FIG. 1 is a perspective view that shows the outline constitution of an exposure apparatus EX according to the present embodiment. In FIG. 1, the exposure apparatus EX is provided with an illumination system IS that illuminates the pattern area of a mask M in which a pattern is formed with exposure light EL such as bright line of a mercury lamp, a mask stage 21 that holds and moves the mask M, a projection system PS that projects the image of a pattern of the mask M that is illuminated by the exposure light EL onto a plate P, a plate stage 22 that holds and moves the plate P, and a mask conveying system (not illustrated) that performs exchange of the mask M between the mask stage 21 and a mask library (not illustrated).

Figure 2A:
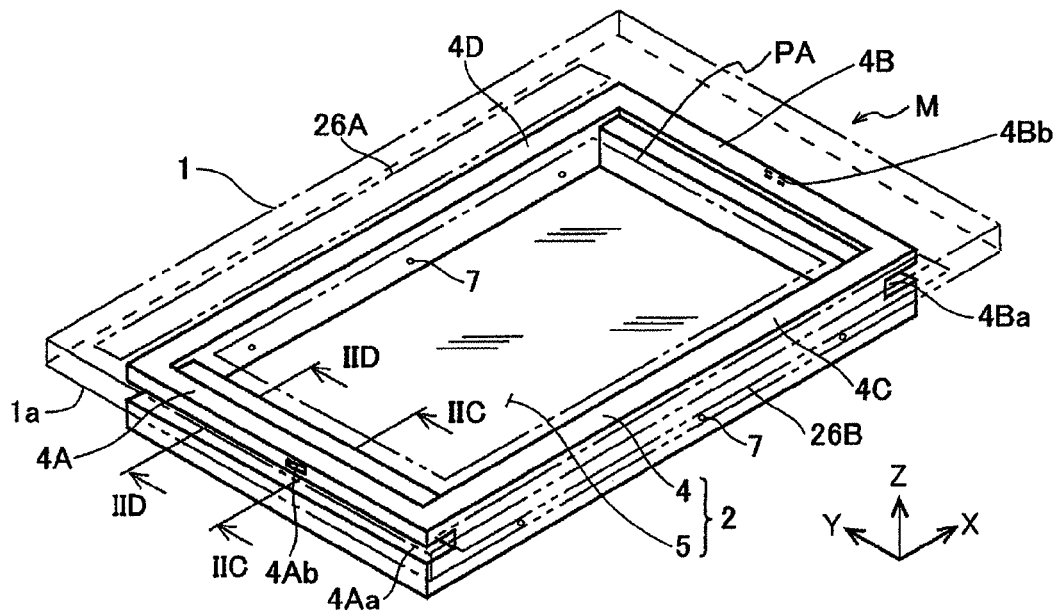
FIG. 2A is a perspective view that shows the mask of FIG. 1.
Figure 2B:
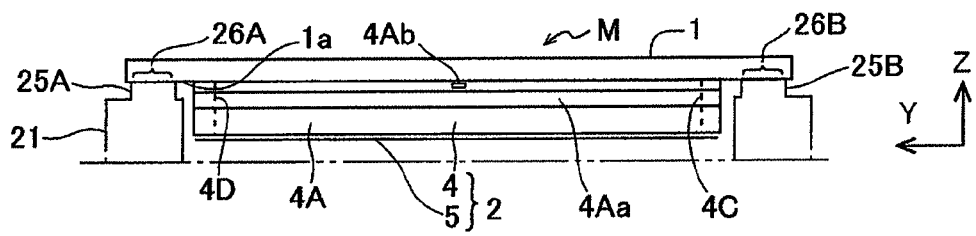
FIG. 2B is a side view that shows the mask of FIG. 2A.

FIG. 2A shows the mask M in FIG. 1, and FIG. 2B is a side view seen from the +X direction of the mask M of FIG. 2A. In FIG. 2A, the mask M includes a mask substrate (mask blank) 1 that is shown by a chain double-dashed line and a dashed line, a pellicle frame 4 of a rectangular frame shape that is bonded so as to cover the pattern area PA of a pattern surface (lower surface) 1a of the mask substrate 1, and a pellicle 5 that is mounted so as to cover the opening portion that is formed by the lower surface of the pellicle frame 4, with the protective apparatus 2 being constituted by the pellicle frame 4 and the pellicle 5. When a foreign matter adheres to the pattern area PA of the mask substrate 1, the image of that foreign matter is transferred as is to the plate P. Therefore, the protective apparatus 2 is provided in order to prevent foreign matter from directly adhering to the pattern area PA.

The mask substrate 1 is a rectangular flat plate that consists of a material that is capable of transmitting the exposure light EL (for example, synthetic quartz), and a circuit pattern (mask pattern) is drawn in the pattern area PA. Moreover, the mask substrate 1, when viewed from the +Z direction in the state of being held in the mask stage 21, is surrounded by a first side surface (first side) (the side surface on the −X direction side) and a second side surface (second side) that are arranged so as to be parallel to the Y axis and opposing the X direction, and a third side surface (third side) (the side surface on the −Y direction side) and a fourth side surface (fourth side) that are arranged so as to be parallel to the X axis and opposing the Y direction, and in the state of there being no sagging due to self weight of the mask substrate 1 (hereinbelow referred to as the reference state), the pattern surface 1a of the mask substrate 1 is parallel to the XY plane (horizontal plane).

As an example, the mask substrate 1 is a rectangular, large flat plate with a width in the Y direction of 1 m to 1.5 m, a length in the X direction of 100 to 300 mm, and a thickness of 10 mm. In the present embodiment, two fixed areas 26A, 26B that are provided in the pattern surface 1a so as to sandwich the pattern area PA of the mask substrate 1 in the Y direction are fixed by vacuum adsorption with adsorption pads 25A, 25B that are disposed on the mask stage 21. In the present embodiment, the fixed areas 26A, 26B are rectangular areas that are long and narrow in the X direction.

Note that even if the surface of the pellicle 5 of the mask M is defocused from the object surface of the projection system PS, when there is a foreign matter of a size that exceeds the allowable range on the surface of the pellicle 5, the image of that foreign matter is transferred to the plate P. Therefore, in order to detect a foreign matter of a size that exceeds the allowable range that has adhered to the surface of the pellicle 5, a foreign matter detecting apparatus 50 shown in FIG. 1 is provided.

In FIG. 1, the plate P includes a flat plate-shaped substrate that consists of a glass plate, and a photoresist (photosensitive agent) that is coated on the surface of the substrate. The surface of the plate P is parallel to the XY plane. The substrate of the plate P may for example be a large glass plate that is called a mother glass. The size of one side of the plate P is for example 500 mm or more. In the present embodiment, as the substrate of the plate P, a rectangular glass plate is used in which one side measures approximately 3 m.

Also, the illumination system IS has a plurality of illumination modules IL (seven units in the present embodiment). The plurality of illumination modules IL of the illumination system IS each illuminate with a uniform illumination distribution a corresponding predetermined illumination region IR of the pattern surface of the mask M by the exposure light EL. The plurality of illumination regions IR are divided into four illumination regions IR of a first row arranged at a predetermined interval in the Y direction and three illumination regions IR of a second row arranged so as to cover the gaps of the illumination regions of the first row and separated in the X direction from the illumination regions of the first row.

The projection system PS is a multi-lens type that has a plurality of projection optical systems PL (seven units in the present embodiment) that are disposed corresponding to the plurality of illumination modules IL. The plurality of projection optical systems PL each consist for example of a reflective refraction system, and form an image of a predetermined projection magnification of the pattern in the corresponding illumination region IR of the mask M on a projection region PR on the plate P. As an example, the predetermined projection magnification is the same magnification, and the plurality of projection regions PR are divided into projection regions PR of two rows that are arranged at a predetermined interval in the X direction similarly to the plurality of illumination regions IR.

Next, the mask stage 21 is capable of moving the mask M in the X direction (scan direction) with respect to the illumination regions IR by operation of a first drive system (not illustrated) that is on a mask base not illustrated and includes for example a linear motor or the like. The mask stage 21 is capable of moving in the X direction, the Y direction, and around an axis (θz direction) parallel to the Z axis.

Also, the mask stage 22 has a support portion that supports at least a portion of the back surface of the plate P. The plate stage 22 is capable of moving the plate P in the X direction with respect to the projection regions PR by operation of a second drive system (not illustrated) that is on a base member not illustrated and includes for example a linear motor or the like. The mask stage 22 is capable of moving in the six degrees of freedom of the X direction, the Y direction, the Z direction, around an axis (θx direction) parallel to the X axis, around an axis (θy direction) parallel to the Y axis, and the θz direction.

Moreover, the exposure apparatus EX is provided with an interferometer system 23 that is capable of measuring the positions of the mask stage 21 and the plate stage 22. The interferometer system 23 has a first interferometer unit 23A that is capable of measuring the position of the mask stage 21 in the XY plane (and by extension the position of the mask M) and a second interferometer unit 23B that is capable of measuring the position of the plate stage 22 in the XY plane (and by extension the position of the plate P). When carrying out exposure processing of the plate P, or when carrying out a predetermined measurement process, based on the measurement result of the interferometer system 23, the above mentioned first and second drive systems are actuated, and position control of the mask stage 21 (mask M) and the plate stage 22 (plate P) is carried out.

The exposure apparatus EX of the present embodiment is a scanning-type exposure apparatus (a so-called scanning stepper) that projects and transfers the image of the pattern of the mask M to the plate P while synchronously moving the mask M and the plate P in the X direction (scanning direction) with respect to the projection system PS. That is, during exposure of the plate P, the mask stage 21 holds the mask M at the object plane side of the projection system PS and moves in the X direction, and the plate stage 22 holds the plate P at the image plane side of the projection system PS and moves in the X direction.

Also, the foreign matter detecting apparatus 50 of the present embodiment has an irradiating portion 52 that is long and thin in the Y direction that irradiates detection light on the front surface (detected surface) of the pellicle 5 of the mask M and a light receiving portion 56 that is long and thin in the Y direction that receives the detection light from the detected surface. The foreign matter detecting apparatus 50 is for example disposed corresponding to at least one of the carry-in route (conveying route) when carrying in the mask M to the mask stage 21 and the carry-out route (conveying route) when carrying out the mask M from the mask stage 21. In the case of a foreign matter of a size exceeding the predetermined allowable range being detected on the front surface of the pellicle 5 of the mask M by the foreign matter detecting apparatus 50 prior to being carried to the mask stage 21, the mask M is for example returned to the mask library (not illustrated) and another mask is carried in.

Figure 3A:
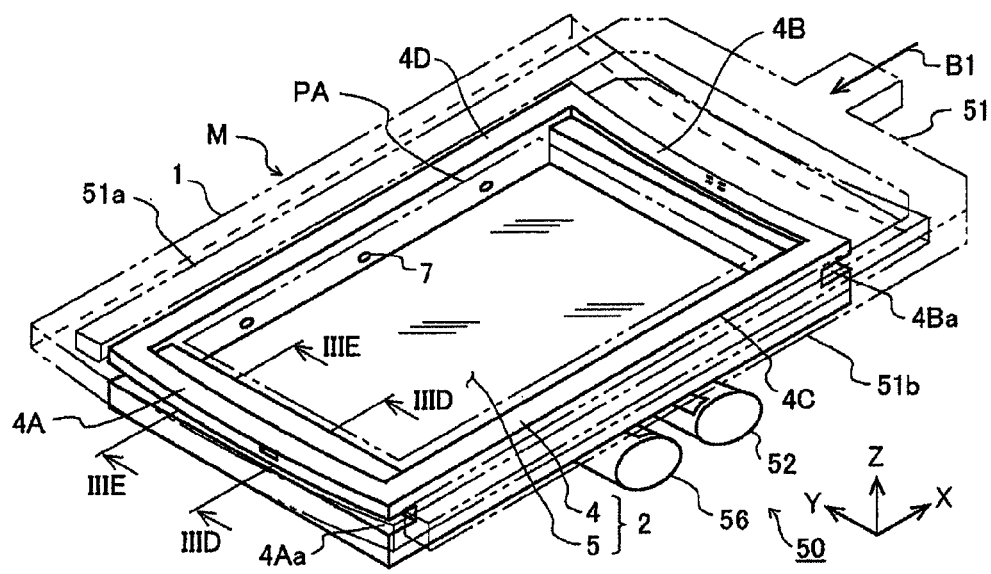
FIG. 3A is a perspective view that shows the mask during foreign matter detection.
Figure 3B:
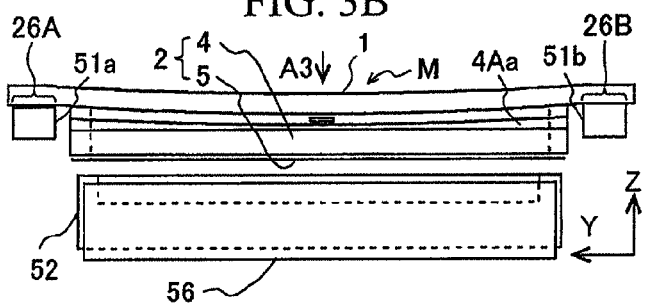
FIG. 3B is a side view that shows the mask of FIG. 3A.
Figure 3C:
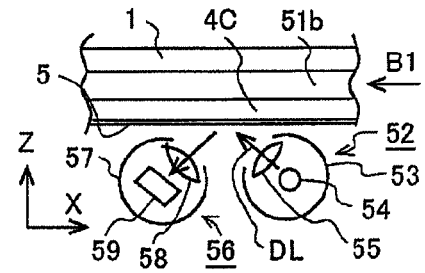
FIG. 3C is a front view that shows the foreign matter detecting apparatus of FIG. 3A.

As shown in FIG. 3C, the irradiating portion 52 of the foreign matter detecting apparatus 50 has a first container 53 with a cylindrical shape in which a light projection slit is formed, a discharge lamp 54 that is disposed along the Y direction in the first container 53, and a lens 55 that condenses the detection light DL emitted from the discharge lamp 54 through the slit onto the front surface (detected surface) of the pellicle 5 of the mask M. Also, the light receiving portion 56 has a second container 57 with a cylindrical shape in which a slit for receiving light is received, a lens 58 that is disposed in the second container 57 and that condenses detection light that has passed through the slit as a result of being reflected or scattered by a foreign matter on the front surface of the pellicle 5, and a photoelectric sensor 59 that is constituted by including a CCD or CMOS two-dimensional imaging sensor that includes pixels of a plurality of rows that receive the condensed detection light and are for example arranged in a predetermined detection area that is long and thin in the Y direction. The photoelectric sensor 59 may be one in which a plurality of two-dimensional or one-dimensional imaging elements are arranged in the Y direction, and in this case, the lens 58 is also provided in a plurality corresponding to the plurality of imaging elements.

By irradiating the detection light DL from the irradiating portion 52 to the pellicle 5 and detecting the detection light DL from the pellicle 5 with the light receiving portion 56, it is possible to detect foreign matter in an area of a predetermined width in the X direction on the front surface of the pellicle 5. Also, by moving the mask M (pellicle 5) in this state in the −X direction shown by the arrow B1, it is possible to detect foreign matter greater than a predetermined size over the entire surface of the pellicle 5.

Figure 2C:
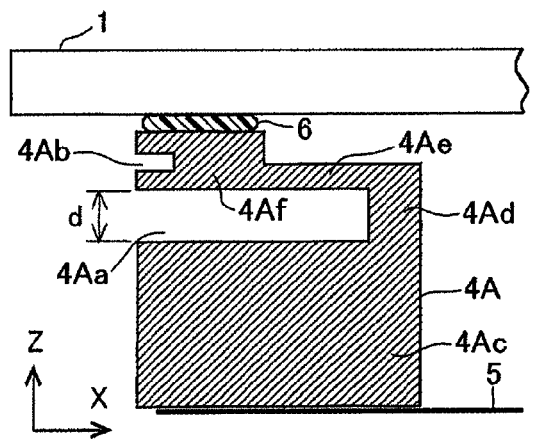
FIG. 2C is an enlarged cross-sectional view along the line IIC-IIC of FIG. 2A.
Figure 2D:
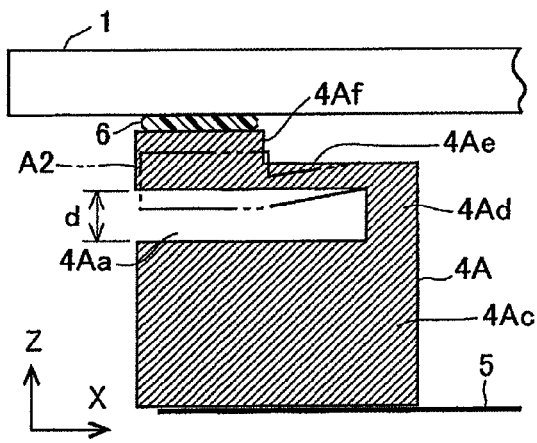
FIG. 2D is an enlarged cross-sectional view along the line IID-IID of FIG. 2A.

Next, the constitution of the mask M of FIG. 1 shall be described with reference to FIG. 2A to FIG. 2D. FIG. 2C is an enlarged cross-sectional view along the line IIC-IIC of FIG. 2A, and FIG. 2D is an enlarged cross-sectional view along the line IID-IID of FIG. 2A. Note that the mask substrate 1 in FIG. 2A and FIG. 2B is shown in the reference state (the state in which there is no sagging due to self weight).

In FIG. 2A, the mask M is constituted by bonding the rectangular frame-shaped pellicle frame 4 on which the pellicle 5 is mounted via an adhesive agent 6 (refer to FIG. 2C so as to surround the pattern area PA that is provided on the pattern surface 1a of the mask substrate 1 so as to ensure airtightness. The pellicle frame 4 is formed by, for example, a metal such as aluminum that is subjected black alumite treatment. A plurality (six in the present embodiment) of small (for example, having a diameter of about 1 mm) venting holes 7 for suppressing expansion and contraction of the pellicle 5 due to differences in internal and external air pressure in the protective apparatus 2 are formed in a portion of the pellicle frame 4. Note that the pellicle frame 4 may be formed from a ceramic or synthetic resin. As the adhesive agent 6, it is possible to use a silicon-based adhesive agent that emits little gas.

The pellicle 5 is formed from a polymer film that is capable of transmitting the exposure light EL such as a cellulose derivative, and the thickness is in a range of several hundred nm to several μm, and is for example 1 μm. The pellicle frame 4 and the pellicle 5 are fixed via an adhesive agent that consists of for example a fluorine resin in a manner ensuring airtightness. Note that the pellicle frame 4 and the pellicle 5 may be fixed by welding after, for example, optical-contact bonding.

Also, the pellicle frame 4 includes a first side portion 4A and a second side portion 4B that are long and thin in the Y direction and arranged in a parallel manner in the X direction at a predetermined interval, and a third side portion 4C that is long and thin in the X direction and connects the end portions in the −Y direction of the first side portion 4A and the second side portion 4B, and a fourth side portion 4D that is long and thin in the X direction and connects the end portions in the +Y direction of the first side portion 4A and the second side portion 4B. The first side portion 4A and the second side portion 4B are disposed on the mask substrate 1 along the pattern area PA so as to sandwich the pattern area PA in the X direction, and the third side portion 4C and the fourth side portion 4D are disposed on the mask substrate 1 along the pattern area PA so as to sandwich the pattern area PA in the Y direction. In the reference state, the heights (thicknesses) in the Z direction of the first side portion 4A, the second side portion 4B, the third side portion 4C, and the fourth side portion 4D are equivalent. Moreover, as shown in FIG. 2B, the cross-sectional shapes of the third side portion 4C and the fourth side portion 4D are rectangular, and they are disposed along (in the vicinity of) the fixed areas 26B and 26A of the mask substrate 1, respectively.

Also, at the portion of the first side portion 4A and the second side portion 4B close to the upper surface that is bonded to the mask substrate 1, depressed portions (trough-like depressions, valleculate portions, hollow portions) 4Aa and 4Ba, respectively, with a depth of width d in the Z direction (the width in the reference state, refer to FIG. 2D) are formed from the outer side along the Y direction. Moreover, in the middle portion in the Y direction of the first side portion 4A and the second side portion 4B, lead-in holes 4Ab, 4Bb that consist of shallow depressed portions are formed between the depressed portion 4Aa, 4Ba and the upper surface of the mask substrate 1. Accordingly, the shapes of the first side portion 4A and the second side portion 4B are mutually axisymmetric in relation to a straight light that is parallel to the Y axis.

The cross-sectional shape of the first side portion 4A of the pellicle frame 4, as shown in FIG. 2C, has a lower end portion 4Ac that is sandwiched by the pellicle 5 and the depressed portion 4Aa, a connecting portion 4Ad that is connected to the end portion on the inner side (the +X direction side) of the lower end portion 4Ac, a flexible portion 4Ae that extends from the upper end of the connecting portion 4Ad to the outer side (−X direction), and an upper end portion 4Af that is bonded to the mask substrate 1 at the distal end of the flexible portion 4Ae, with the mask substrate 1 being bonded via a adhesive agent 6 to the upper surface of the upper end portion 4Af. Also, a step difference is formed so that the upper surface of the upper end portion 4Af is higher than the upper surface of the flexible portion 4Ae, and the lead-in hole 4Ab is formed in a portion of the upper end portion 4Af.

As an example, the height in the Z direction of the pellicle frame 4 (the first side portion 4A) is 5 to 10 mm, the thickness of the adhesive agent 6 is 0.1 to 0.3 mm, the width in the X direction of the first side portion 4A is 5 to 10 mm, the thickness of the flexible portion 4Ae is 1 to 2 mm, and the width in the X direction of the upper end portion 4Af is ½ to ⅓ of the width in the X direction of the first side portion 4A. Moreover, the width in the X direction of the upper end portion 4Af is nearly the same as the width in the Y direction of the third side portion 4C and the fourth side portion 4D.

According to this constitution, the lower end portion 4Ac and the upper end portion 4Af of the first side portion 4A are connected by a resilient hinge mechanism so that the gap in the Z direction (the width of the depressed portion 4Aa) can change via the connecting portion 4Ad and the flexible portion 4Ae. Accordingly, in the state of the positions of the fixed areas 26A, 26B being fixed, when the mask substrate 1 sags in the −Z direction under its own weight, as shown in FIG. 2D, since the flexible portion 4Ae sags in response to that, the upper end portion 4Af that supports the mask substrate 1 is capable of displacement in the −Z direction as shown by the position A2. In this case, the width d of the depressed portion 4Aa in the reference state is set so as to become wider than the maximum value of the sag amount due to the self weight of the mask substrate 1 when the mask substrate 1 is fixed by adsorption at the fixed areas 26A and 26B. The maximum value of this sag amount is decided based on actual measurement or simulation. A change in the height in the Z direction of the first side portion 4A due to such elastic deformation of the flexible portion 4Ae occurs similarly in the second side portion 4B.

In contrast to this, the third side portion 4C and the fourth side portion 4D of the pellicle frame 4 hardly deform including in the Z direction. Accordingly, the rigidity in the Z direction of the first side portion 4A and the second side portion 4B is set to be substantially lower than the rigidity of the third side portion 4C and the fourth side portion 4D.

Figure 3D:
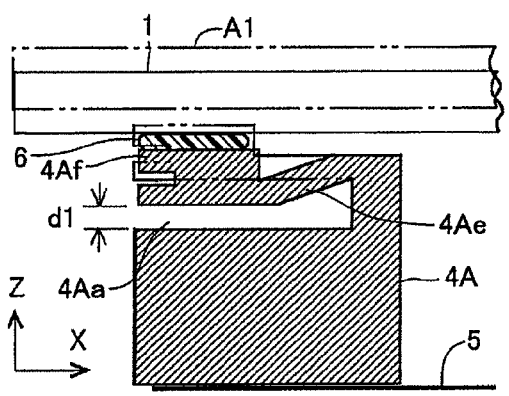
FIG. 3D is an enlarged cross-sectional view along the line IIID-IIID of FIG. 3A.
Figure 3E:
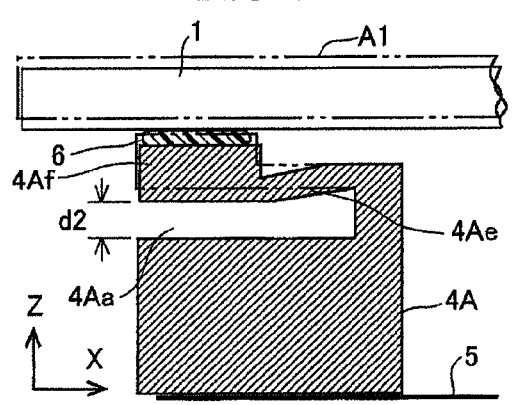
FIG. 3E is an enlarged cross-sectional view along the line IIIE-IIIE of FIG. 3A.

Next, for the exposure apparatus EX of the present embodiment, an example of the operation when detecting a foreign matter on the front surface of the pellicle 5 of the mask M with the foreign matter detecting apparatus 50 shall be described with reference to FIG. 3A to FIG. 3E. FIG. 3A is a perspective view that shows the mask M during foreign matter detection, FIG. 3B is a side view that shows the mask M of FIG. 3A from the +X direction, FIG. 3C is a partial cutaway front view showing the foreign matter detecting apparatus 50 of FIG. 3A, FIG. 3D is an enlarged cross-sectional view along the line IIID-IIID of FIG. 3A, and FIG. 3E is an enlarged cross-sectional view along the line IIIE-IIIE of FIG. 3A.

In FIG. 3A, the mask substrate 1 of the mask M is held by vacuum absorption by the holding portions 51a, 51b at two locations of the conveying arm 51 shown by the chain double-dashed line during conveying of the mask. The fixed areas 26A, 26B of the mask substrate 1 that are held by the holding portions 51a, 51b are the same as the portions held by the mask stage 21. Also, the pellicle 5 of the mask M is disposed at a position of a predetermined gap in the Z direction with respect to the irradiating portion 52 and the light receiving portion 56 of the foreign matter detecting apparatus 50. By moving the conveying arm 51 in the −X direction shown by the arrow B1 by a driving mechanism (not illustrated) in this state, foreign matter is detected over the entire surface of the pellicle 5 by the foreign matter detecting apparatus 50.

In the present embodiment, since both ends of the mask substrate 1 in the Y direction are held by the holding portions 51a, 51b, the mask substrate 1 sags in the −Z direction (vertical direction) by self weight between the holding portions 51a, 51b (between the fixed areas 26A, 26B). The sag amount becomes greatest at the center portion in the Y direction of the mask substrate 1. In the center portion, as shown in FIG. 3D, the position of the mask substrate 1 moves furthest downward with respect to the position A1 of the reference state. In this state, the flexible portion 4Ae of the first side portion 4A sags substantially, and the width of the depressed portion 4Aa changes from width d in the reference state to a narrowest width d1 that nearly subtracts the displacement of the mask substrate 1. In contrast, at a position shifted in the Y direction close to the holding portion 51a (or 51b), the sag amount of the mask substrate 1 becomes less. Accordingly, at a position shifted in the Y direction, as shown in FIG. 3E, the sag amount of the flexible portion 4Ae of the first side portion 4A becomes less, and the width d2 of the depressed portion 4Aa becomes wider than the width d1. In other words, the height in the Z direction at each position in the Y direction of the first side portion 4A (the width of the depressed portion 4Aa) becomes less by the displacement amount due to self weight of the mask substrate 1. The decrease of the height in the Z direction corresponding to the sag amount due to self weight of the mask substrate 1 occurs similarly at the second side portion 4B. Moreover, the volume in the pellicle frame 4 changes due to the sagging of the mask substrate 1, but since there is no difference between the internal and external air pressure due to the venting holes 7 provided in the pellicle frame 4, there is no bloating or the like of the pellicle 5 due to a difference between the internal and external air pressure.

Accordingly, since the height of the first side portion 4A and the second side portion 4B of the pellicle frame 4 changes in accordance with the sag amount even if the mask substrate 1 sags in the −Z direction as shown by the arrow A3 in FIG. 3B, no deformation is exerted on the pellicle 5 that is mounted on the undersurface of the pellicle frame 4, and so the flatness of the pellicle 5 is maintained nearly the same as the flatness in the case of the reference state. For that reason, it is possible to detect a foreign matter over the entire surface of the pellicle 5 with high precision by the foreign matter detecting apparatus 50.

Also, in the case of holding the mask M with the mask stage 21 of FIG. 1, the mask substrate 1 sags under its own weight. Also in this case, since the height of the pellicle frame 4 partially changes, the flatness of the pellicle 5 is maintained to at a high level. Accordingly, since the state is maintained in which there is practically no influence of the pellicle 5 on the exposure light EL transmitted through the mask substrate 1 of the mask M, the image formation characteristics are maintained at a high level.

Figure 4A:
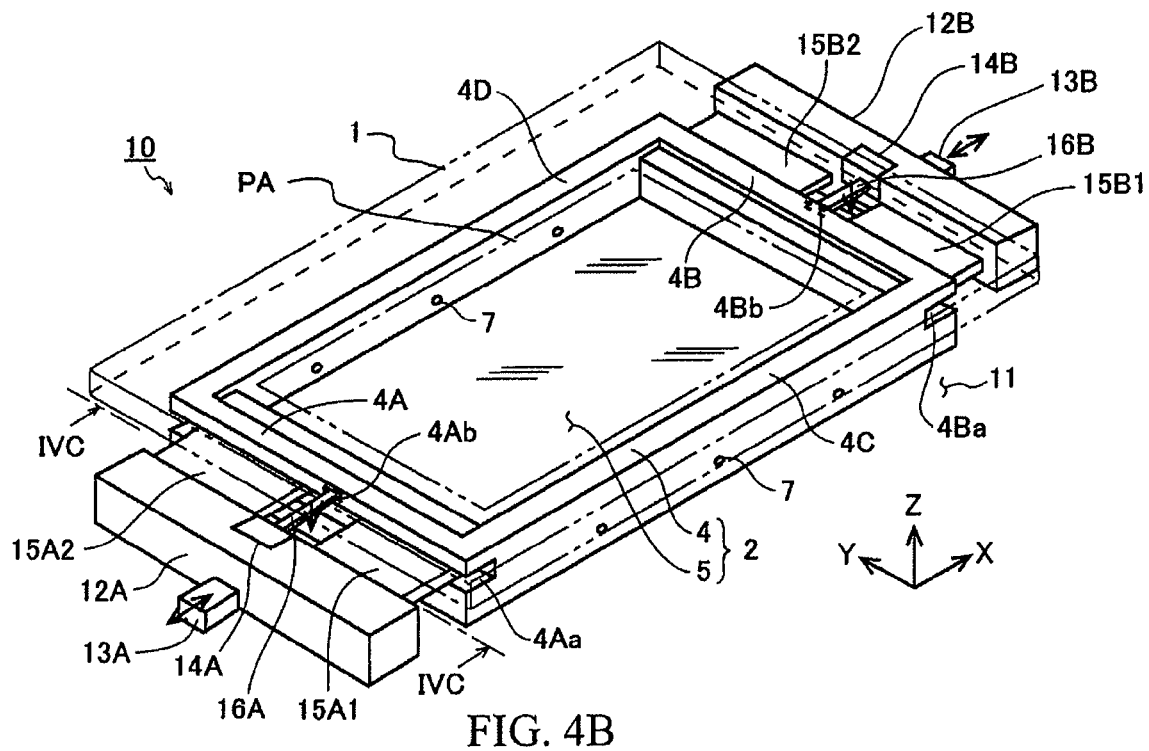
FIG. 4A is a perspective view that shows the principle portions of a mask fabricating apparatus during fabrication of the mask.

Next, the fabrication processes of the mask M shall be described with reference to FIG. 4A to FIG. 4C. FIG. 4A is a perspective view that shows the principle portions of a mask fabricating apparatus 10 during fabricating of the mask M, FIG. 4B is a partial cutaway front view that shows the principle portions of the mask fabricating apparatus 10, and FIG. 4C is a cross-sectional view along the line IVC-IVC of FIG. 4A.

Figure 4B:
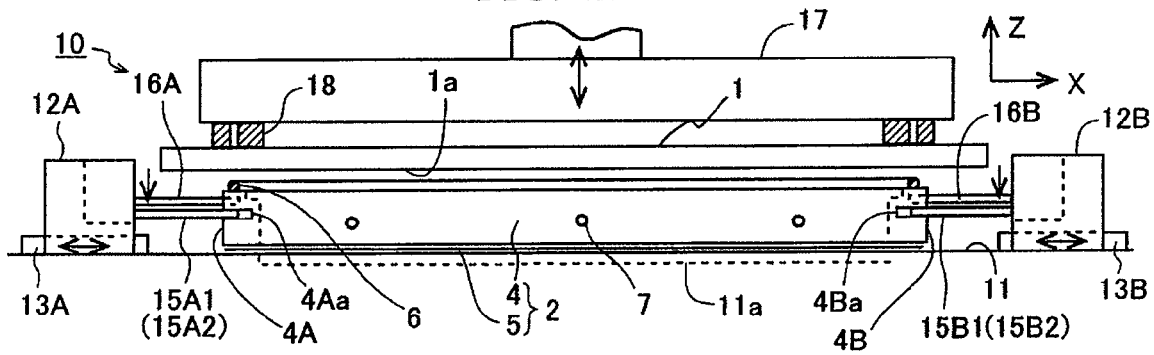
FIG. 4B is a partial cutaway front view that shows the principle portions of the mask fabricating apparatus.
Figure 4C:
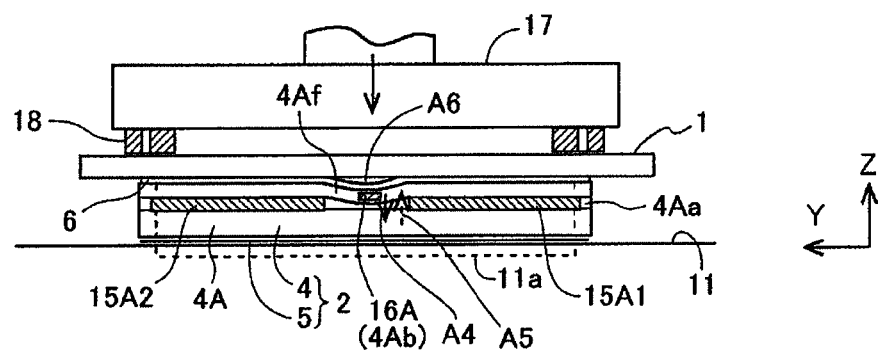
FIG. 4C is a cross-sectional view along the line IVC-IVC of FIG. 4A.

In FIG. 4B, the front surface of the pellicle 5 of the protective apparatus 2 is placed on the flat upper surface of the base member 11 of the mask fabricating apparatus 10. A depressed portion 11a is formed on the upper surface of a base member 11 at a portion corresponding to the inside area of the pellicle frame 4. Guide members 13A and 13B are fixed parallel to the X axis so as to sandwich the protective apparatus 2 in the X direction on the upper surface of the base member 11, and moving bodies 12A and 12B that are thin and long in the Y direction are mounted along the guide members 13A and 13B in a manner capable of moving in the X direction by a driving mechanism (not illustrated). Also, the moving bodies 12A and 12B are provided with blades 15A1, 15A2 and blades 15B1, 15B2 that are capable of fitting in the depressed portion 4Aa of the first side portion 4A and the depressed portion 4Ba of the second side portion 4B, respectively, of the pellicle frame 4. The distal end portions of the blades 15A1, 15A2, 15B1, 15B2 are formed tapered to become thinner toward the distal end side. Moreover, lever portions 16A and 16B that are capable of being inserted in a lead-in hole 4Ab of the first side portion 4A and a lead-in hole 4Bb of the second side portion 4B, respectively, are fixed to Z driving portions 14A and 14B of the center portion in the Y direction of the moving bodies 12A and 12B. The Z driving portions 14A and 14B can move the lever portions 16A and 16B that are inserted in the lead-in holes 4Ab and 4Bb, respectively, in the −Z direction.

Also, the upper surface of the mask substrate 1 is adsorptively held via a rectangular frame-shaped air pad 18 that is positioned nearly opposite the pellicle frame 4 on a lifting portion 17 that is capable of moving in the Z direction by a driving mechanism (not illustrated). A circuit pattern is drawn on the pattern area PA of the pattern surface 1a of the mask substrate 1, and the pellicle frame 4 and the pellicle 5 are fixed by bonding or the like.

In the case of fabricating the mask M using the mask fabricating apparatus 10, first the protective apparatus 2 is placed on the upper surface of the base member 11 so that the first side portion 4A of the pellicle frame 4 becomes parallel with the Y axis, and then the ring-shaped adhesive agent 6 is placed on the upper surface of the pellicle frame 4. In this state, the mask substrate 1 is moved above the pellicle frame 4 by the lifting portion 17.

Afterward, as shown in FIG. 4A, the moving bodies 12A and 12B move in the direction of the protective apparatus 2, and the distal ends of the blades 15A1, 15A2 and the lever portion 16A of the moving body 12A is inserted in the depressed portion 4Aa and the lead-in hole 4Ab, and the distal ends of the blades 15B1, 15B2 and the lever portion 16B of the moving body 12B is inserted in the depressed portion 4Ba and the lead-in hole 4Bb. In this state, when the mask substrate 1 is tightly fitted on the pellicle frame 4 via the adhesive agent 6, since the internal air is not rapidly exhausted by the plurality of venting holes 7, there is the risk of the pellicle 5 temporarily swelling after joining. Also, when conveying the mask M in the state of the pellicle 5 being swollen, there is the risk of the pellicle 5 making contact with members that are disposed around the conveying path, and the pellicle 5 being damaged as a result. Also, when performing foreign matter detection by the foreign matter detecting apparatus 50 in the state of the pellicle being swollen, there is the risk of misdetection occurring.

Therefore, in order to reduce the difference between the internal and external air pressures in the protective apparatus 2 as much as possible at the time of bonding the mask substrate 1 to the pellicle frame 4, the lever portions 16A, 16B move by a predetermined amount in the −Z direction as shown by the arrow A4 (refer to FIG. 4C) by the Z driving portions 14A, 14B. Thereby, as shown by FIG. 4C, the upper end portion 4Af in the vicinity of the lead-in hole 4Ab at the first side portion 4A of the pellicle frame 4 is pulled down in the −Z direction, whereby an opening A6 is produced. Similarly, an opening is produced on the side of the second side portion 4B.

In this state, in FIG. 4B, the lifting portion 17 is lowered in the −Z direction to make the mask substrate 1 make contact with the adhesive agent 6, and press the mask substrate 1 toward the protective apparatus 2 side. At this time, since at least a portion of the air inside of the protective apparatus 2 is discharged from the opening A6, swelling of the pellicle 5 is prevented. Then, after the lever portions 16A, 16B are moved in the +Z direction as shown by the arrow A5 by the Z driving portions 14A, 14B, the moving bodies 12A, 12B move so as to separate from the protective apparatus 2, whereby the distal ends of the blades 15A1, 15A2, 15B1, 15B2 and the lever portions 16A, 16B are pulled out from the depressed portions 4Aa, 4Ba and the lead-in holes 4Ab, 4Bb. Thereby, the mask M is complete.

The operational advantages of the present embodiment are as given below.

(1) The protective apparatus 2 of the present embodiment is a protective apparatus that protects the pattern area (PA) of the pattern surface 1a (front surface) of the mask substrate 1, and is provided with the pellicle frame 4 (support mechanism) that is bonded to the pattern surface 1a so as to surround the pattern area PA and the pellicle 5 (protective film) that is mounted on the pellicle frame 4 so as to cover the opening portion that faces the pattern area PA of the pellicle frame 4. The pellicle frame 4 includes the first side portion 4A and the second side portion 4B (first portions) and the third side portion 4C and the fourth side portion 4D (second portions) that are disposed along the pattern area PA, and in relation to the normal direction (Z direction) of the pattern surface 1a, the rigidity of the first side portion 4A (and the second side portion 4B) is lower than the rigidity of the third side portion 4C (and the fourth side portion 4D).

Also, the mask M of the present embodiment is provided with the mask substrate 1 that has the pattern area PA in which a pattern to be transferred is formed and the protective apparatus 2 that is provided so as to protect the pattern area PA of the mask substrate 1.

According to the present embodiment, when the mask substrate 1 that is the subject of protection sags, since the first side portion 4A (and the second side portion 4B) with low rigidity sag, and the third side portion 4C (and the fourth side portion 4D) hardly sag, sagging of the pellicle 5 is suppressed. Accordingly, even if the mask substrate 1 is enlarged, and the sag amount of the mask substrate 1 under its own weight increases, since the pellicle 5 is maintained in a nearly flat state, it is possible to, for example, perform detection of foreign matter on the front surface of the pellicle 5 with high precision.

(2) Also, since the first side portion 4A and the second side portion 4B of the pellicle frame 4 include a resilient hinge mechanism that includes a flexible portion 4Ae that has flexibility in the Z direction, it is possible to impart flexibility in the Z direction to the first side portion 4A and the second side portion 4B with a simple mechanism.

Moreover, this resilient hinge mechanism includes a plate-shaped portion in which the depressed portions 4Aa, 4Bb are provided nearly parallel to the pattern surface 1a. Accordingly, it is possible to readily form the first side portion 4A and the second side portion 4B just by forming the depressed portions 4Aa, 4Ba.

(3) Also, the lead-in holes 4Ab, 4Bb (cutaway portions) are provided in the vicinity of the depressed portions 4Aa, 4Ba (resilient hinge mechanisms) in the center of the first side portion 4A and the second side portion 4B. Accordingly, during fabrication of the mask M, it is possible to prevent swelling of the pellicle 5 by ensuring a necessary ventilation path (venting portion) by pulling down the upper end portion 4Ab and the like via the lead-in holes 4Ab, 4Bb.

(4) Also, the two locations of the third side portion 4C and the fourth side portion 4D of the pellicle frame 4 are disposed in the vicinity of the two locations of the fixed areas 26A, 26B where the mask substrate 1 is supported by the mask stage MST or the conveying arm 51.

In this case, even if the mask substrate 1 sags in the area between the fixed areas 26A, 26B, since the first side portion 4A and the second side portion 4B sag in correspondence to that sag, hardly any distortion is produced in the pellicle 5.

(5) Also, the mask conveying system of the present embodiment has the conveying arm 51 (support portion) that supports the mask substrate 1 of the mask M, and the drive apparatus (not illustrated) that drives the conveying arm 51 that supports the mask M, and the conveying arm 51 supports the fixed areas 26A, 26B in the vicinity of the third side portion 4C and the fourth side portion 4D of the pellicle frame 4 in the pattern surface 1a of the mask substrate 1. Accordingly, even if the mask substrate 1 sags between the fixed areas 26A, 26B, since the first side portion 4A and the second side portion 4B of the pellicle frame 4 sag in correspondence to that sag, the flatness of the pellicle 5 is maintained at a high degree, and it is possible to perform detection of foreign matter on the pellicle 5 with a high degree of precision.

(6) Also, the fabricating method of the mask M of the present embodiment is a mask fabricating method that bonds the protective apparatus 2 to the mask substrate 1 so as to cover the pattern area PA of the mask, and includes a process that places the adhesive agent 6 (adhesive agent) between the pellicle frame 4 of the protective apparatus 2 and the mask substrate 1 (FIG. 4B), and a process that biases the pellicle frame 4 to the pattern surface 1a of the mask substrate via the adhesive agent 6 while supplementing the rigidity of the first side portion 4A and the second side portion 4B of the pellicle frame 4 (FIG. 4C. Accordingly, it is possible to bond the entire upper surface of the pellicle frame 4 and the pattern surface of the mask substrate 1 even if the rigidity of the first side portion 4A and the second side portion 4B is low.

(7) Also, since the blades 15A1, 15B1 (spacers) are disposed in the depressed portions 4Aa, 4Ba in order to supplement the rigidity of the first side portion 4A and the second side portion 4B, it is possible to readily supplement the rigidity.

(8) Also, the exposure apparatus EX of the present embodiment is one that, in an exposure apparatus that exposes a plate P (object) with the exposure light EL via a mask and the projection system PS (projection optical system), uses the mask M of the present embodiment as that mask. In this case, since it is possible to detect the presence of foreign matter on the front surface of the pellicle 5 of the mask M, it is possible to obtain high throughput using a large-size mask M, and it is possible to prevent the image of a pattern not required for the plate P from being transferred.

Note that in the present embodiment the following modifications are possible.

(1) The mask substrate 1 of the mask M is a rectangle, but the mask substrate 1 may also be virtually a square flat plate.

(2) Also, in FIG. 2 and the like, the depressed portion 4Aa of the first side portion 4A was illustrated as one that is formed along the entire region in the Y direction of the first side portion 4A, but it may also be formed in a portion in the Y direction of the first side portion. In this case as well, it is possible to suppress sag of the pellicle 5. Note that in order to sufficiently suppress sag of the pellicle 5, the width in the Y direction of the depressed portion 4Aa is preferably equal to or greater than the width in the Y direction of the opening formed by the undersurface of the pellicle frame 4 (that is, the space between the third side portion 4C and the fourth side portion 4D).

(3) Instead of the adhesive agent 6, it is possible to use a so-called hot-melt adhesive agent (for example, acrylic, or the like) or double-sided tape.

(4) The lead-in holes 4Ab, 4Bb need not always be provided in the pellicle frame 4. In the case of there being no lead-in holes 4Ab, 4Bb, during fabrication of the mask M, it is preferable to bring the mask substrate 1 into contact with the adhesive agent 6 that is provided on the upper surface of the pellicle frame 4 at a slow speed.

(5) Since the projection system PS of the exposure apparatus EX is a multi-lens type, even if the mask M and the plate P have a large area, it is possible to make the overall size of the projection system PS compact. Note that the number of projection optical systems PL and illumination modules IL is not limited to seven, and at least one may be provided. Also, the projection optical system PL of the present embodiment is an equal magnification system, but it may also be reduction system or a magnification system, and it may form an inverted image or an erect image. Also, the projection optical system PL may be a refraction system or a reflection system.

<Second Embodiment>

Figure 5A:
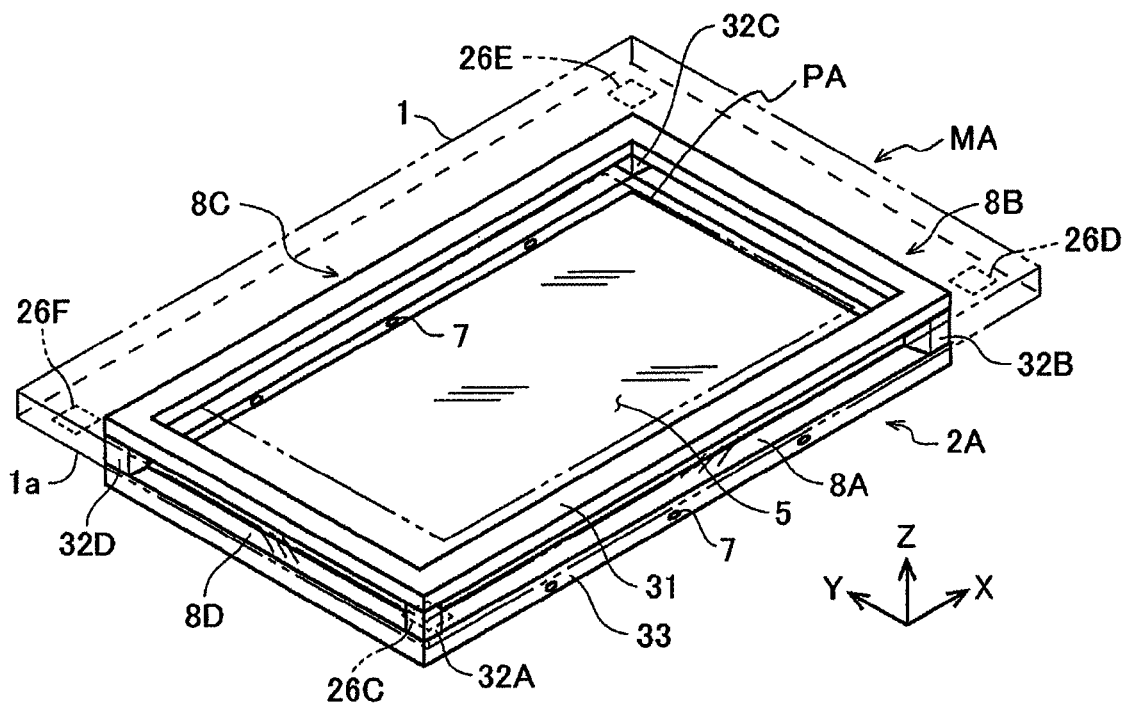
FIG. 5A is a drawing that shows the mask of the second embodiment, and is a perspective view that shows the mask.
Figure 5B:
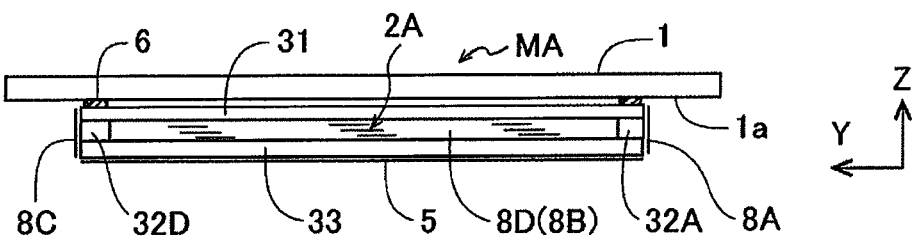
FIG. 5B is a partial cutaway side view that shows the mask.

Next, a second embodiment of the present invention shall be described with reference to FIG. 5A to FIG. 5E. In FIG. 5A to FIG. 5D, portions corresponding to FIG. 3A to FIG. 3E are denoted by the same reference numbers, with detailed explanations thereof omitted. FIG. 5A is a perspective view that shows the mask MA of the present embodiment, and FIG. 5B is a side view of the mask MA in FIG. 5A viewed from the +X direction. Note that in FIG. 5B, the adhesive agent 6 is shown in cross section.

In FIG. 5A, the mask MA has a mask substrate 1 and a protective apparatus 2A that is bonded so as to cover the pattern area PA of the pattern surface 1a of the mask substrate 1. That is, the rectangular frame-shaped first frame 31 is bonded via the adhesive agent 6 (refer to FIG. 5B) to the pattern surface 1a. Also, rods 32A to 32D with a square column shape are fixed to the four corners of the first frame 31, and a second frame 33 with the same shape as the first frame 31 is fixed to the lower end of the rods 32A to 32D. That is, the rods 32A and 32B and the rods 32C and 32D are respectively disposed along the X direction, at both sides of the Y direction mutually sandwiching the pattern area PA, and disposed in the vicinity of both end portions in the X direction of the pattern area PA. The columnar height (length in the Z direction) of the rods 32A to 32D is made to be equivalent. A plurality of venting holes 7 are provided in the second frame 33. The frames 31, 33 and the rods 32A to 32D are formed from a metal such as aluminum (or ceramic and the like). The fixing of the first frame 31 and the rods 32A to 32D, and the fixing of the rods 32A to 32D and the second frame 33 is for example achieved by welding or screw fastening.

Also, the pellicle 5 is mounted on the opening portion that is formed by the lower surface of the second frame 33 (the opening portion that faces the pattern area PA of the mask substrate 1), and the opening portion between the rods 32A, 32B, the opening portion between the rods 32B, 32C, the opening portion between the rods 32C, 32D, and the opening portion between the rods 32D, 32A are covered to be made airtight by thin-film sheets 8A, 8B, 8C, 8D of the same material as the pellicle 5. Note that openings that ensure ventilation of the venting holes 7 are formed at the portions of the sheets 8A to 8D where the venting holes 7 are located. The sheets 8A to 8D are fixed to the frames 31, 33 and the rods 32A to 32D by an adhesive agent that consists of for example a fluorine resin, similarly to the pellicle 5. Note that the sheets 8A to 8D may also be fixed by welding after, for example, optical-contact bonding.

In this way, the protective apparatus 2A that covers the pattern region PA of the mask substrate 1 is constituted from the first frame 31, the rods 32A to 32D, the second frame 33, the sheets 8A to 8D, and the pellicle 5. In the protective apparatus 2A, the rigidity in the Z direction is high at the four corner portions where the rods 32A to 32D are provided, so the gap in the Z direction between the frames 31, 33 hardly changes. In contrast, at the four sides that include the portions that are covered by the sheets 8A to 8D between the rods 32A to 32D, since the rigidity in the Z direction is rather low, the gap in the Z direction between the frames 31, 33 easily varies.

Figure 5C:
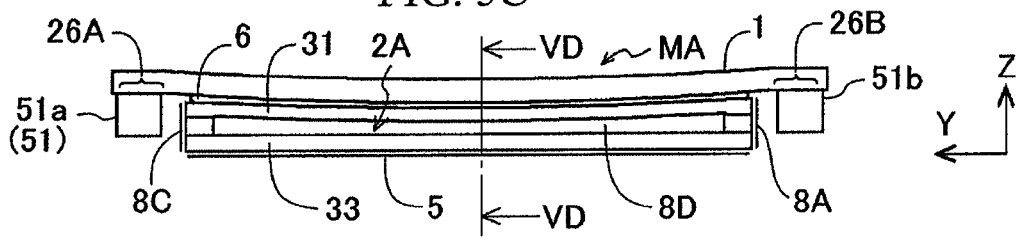
FIG. 5C is a side view that shows the mask during foreign matter detection.

Next, during the detection for foreign matter on the front surface of the pellicle 5 of the mask MA, as shown in FIG. 5C, the fixed areas 26A, 26B at both end portions in the Y direction of the mask substrate 1 of the mask MA are held by adsorption by holding portions 51a, 51b of the conveying arm 51. Accordingly, the four corner portions that include the rods 32A to 32D of the protective apparatus 2A are supported at the same height (Z position). This is the same as during exposure in which the mask MA is used by being placed on the mask stage 21. Then, the foreign matter detecting apparatus 50 of FIG. 3A (not illustrated in FIG. 5C) is disposed in the vicinity of the undersurface of the pellicle 5 of the protective apparatus 2A. In this case, the mask substrate 1 sags under its own weight in the −Z direction in the area between the fixed areas 26A, 26B, with the sag amount becoming a maximum at the center portion particularly in the Y direction.

Figure 5D:
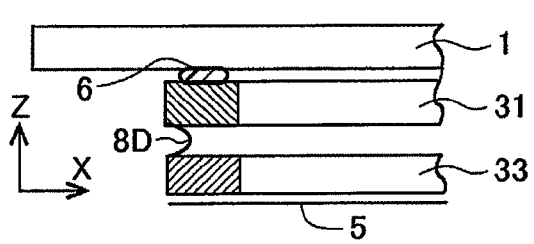
FIG. 5D is an enlarged cross-sectional view along the line VD-VD of FIG. 5C.
Figure 5E:
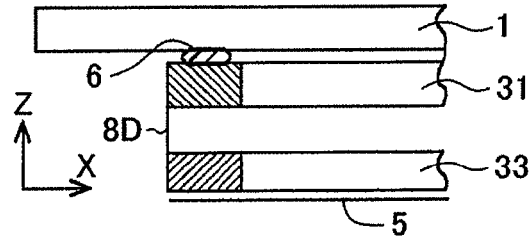
FIG. 5E is an enlarged cross-sectional view that shows a portion in which there is no slack in a sheet on the side of the mask.

At the center portion, as shown in the enlarged cross-sectional view of FIG. 5D, the first frame 31 sags in the −Z direction in accordance with the sag amount of the mask substrate 1, and the slack of the sheet 8D (and the sheet 8B of FIG. 5A) becomes a maximum in accordance with that.

As shown in FIG. 5C, because the first frame 31 sags in the −Z direction in accordance with the sag of the mask substrate 1, and the sheets 8D, 8B slacken together with the sag of the first frame 31, deformation is not exerted to the pellicle 5, the flatness of the pellicle 5 is maintained to a high degree, and it is possible to perform detection of foreign matter on the front surface of the pellicle 5 by the foreign matter detecting apparatus 50 with high accuracy.

Next, a portion of the fabricating processes of the mask MA of the present embodiment shall be described with reference to FIG. 6A and FIG. 6B. At this time, a circuit pattern is drawn on the pattern area PA of the mask substrate 1, and the first frame 31 and the second frame 33 are connected via the rods 32A to 32D.

Figure 6A:
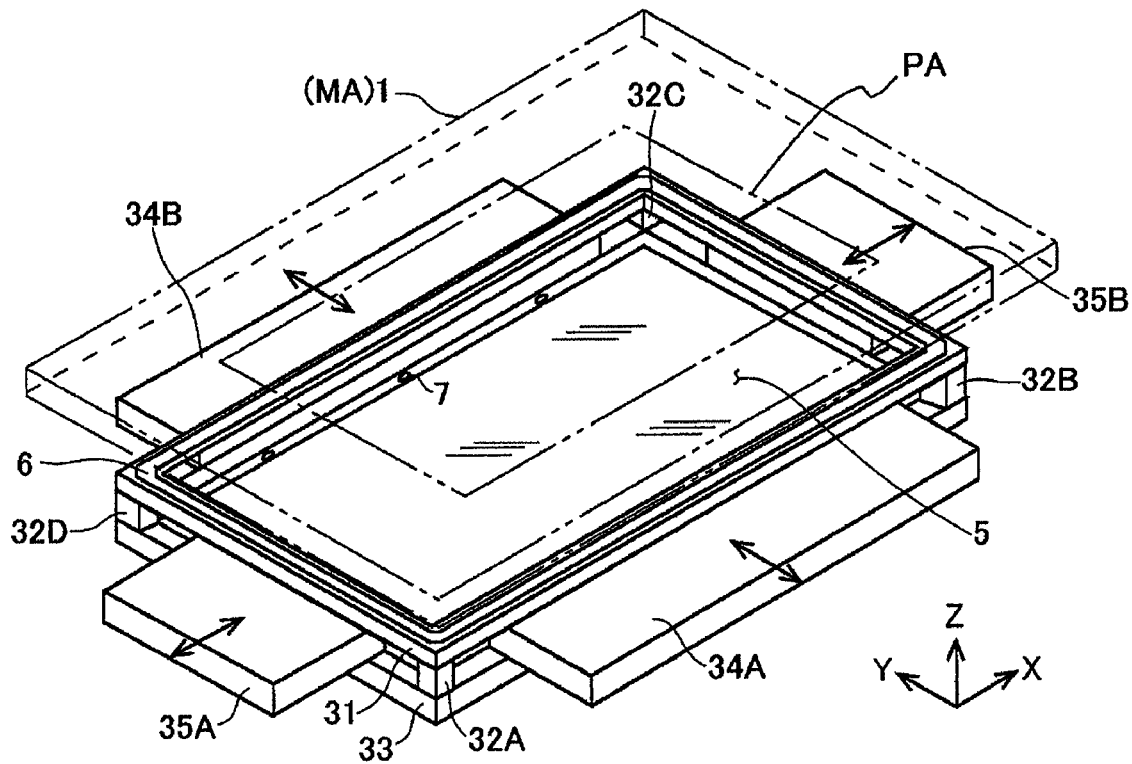
FIG. 6A is a perspective view that shows the mask during fabrication in the second embodiment.

First, as shown in FIG. 6A, the second frame 33 is placed on the top surface of the base member (not illustrated), and the adhesive agent 6 is applied in a ring shape on the upper surface of the first frame 31. Next, the blades 34A, 34B and the blades 35A, 35B are inserted in the opening portions of the side surfaces between the rods 32A to 32D, the mask substrate 1 is placed via the adhesive agent 6 on the top surface of the first frame 31, and by applying pressure to the rectangular frame-shaped portion of the top surface of the mask substrate 1 that corresponds to the first frame 31, the mask substrate 1 and the first frame 31 are bonded via the adhesive agent 6.

Figure 6B:
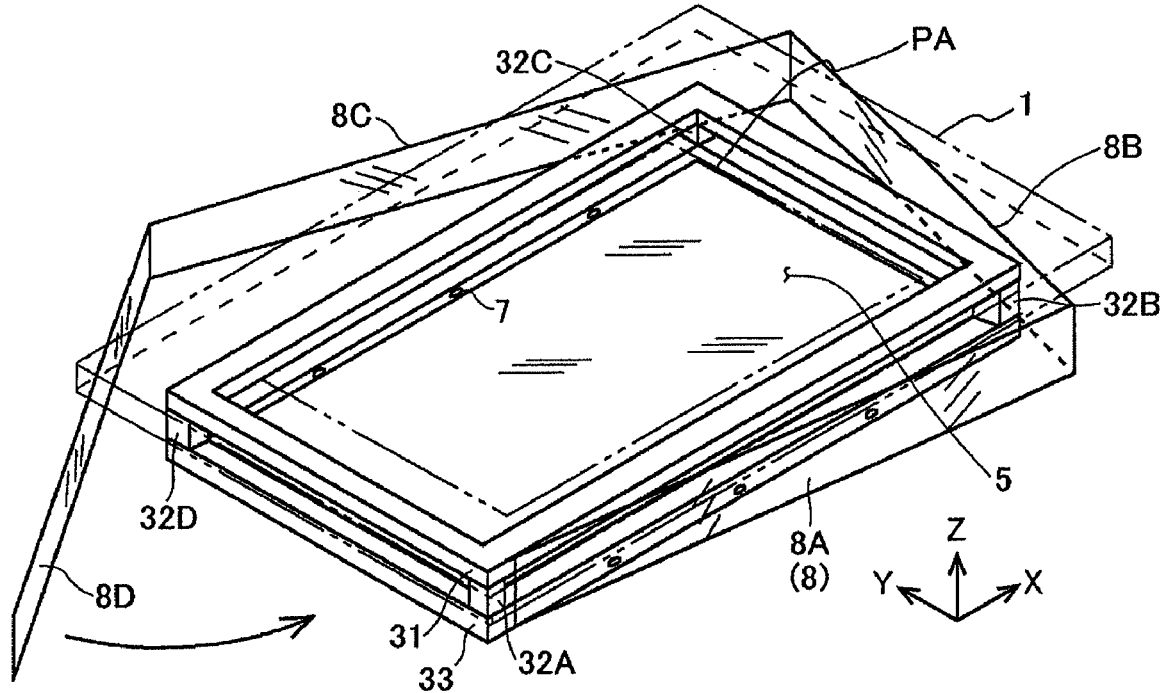
FIG. 6B is a perspective view that shows the state of mounting a sheet on the side surface of the protective apparatus of FIG. 6A.

Afterward, as shown in FIG. 6B, a sheet 8 is prepared having nearly the width between the upper end and the lower end of the frames 31, 33, a length that is the same as the total circumference of the side surfaces of the first frame 31, and made of the same material as the pellicle 5, and the sheet 8 is mounted while gradually bonding it from the rod 32A to the rods 32B, 32C, 32D, 32A, and openings are made in the sheet 8 at portions corresponding to the venting holes 7. Thereby, the sheets 8A to 8D are practically mounted, and the mask MA is completed.

The operational advantages of the present embodiment are as given below.

(1) The protective apparatus 2A that the mask MA of the present embodiment is provided with is a protective apparatus that protects the pattern area PA of the pattern surface 1a of the mask substrate 1, and is provided with a frame mechanism (support mechanism) that consists of the first frame 31, the rods 32A to 32D, and the second frame 33 that are bonded together so as to surround the pattern area PA on the pattern surface 1a, and the pellicle 5 that is mounted on the second frame 33 so as to cover the opening portion that faces the pattern area PA of the frame mechanism. The frame mechanism includes four side portions (first portion) in which openings are provided between the frames 31, 33 that are disposed along the pattern area PA, and four corner portions (second portion) in which the rods 32A to 32D (support columns) are provided, and in relation to the normal direction (Z direction) of the pattern surface 1a, the rigidity of the side portions where the openings are provided is lower than the rigidity of the corner portions where the rods 32A to 32D are provided.

According to the present embodiment, when the mask substrate that is the subject of protection sags, since the side portions in the frame mechanism (the portions between the rods 32A to 32D) sag, and the corner portions of the rods 32A to 32D hardly sag (that is, the height in the Z direction does not change), deformation is not exerted on the pellicle 5, and so sag of the pellicle 5 is suppressed. Accordingly, even if the mask substrate 1 is increased in size, it is possible to perform detection of foreign matter on the front surface of the pellicle 5 with high accuracy.

Note that the rods 32A to 32D may incline from the perpendicular direction with respect to the pattern surface 1a of the mask substrate 1.

(2) Also, the portion of the openings between the rods 32A to 32D is sealed by the sheets 8A to 8D (sealing members) having a lower rigidity than the rods 32A to 32D in the Z direction. Thereby, since hardly any gaseous matter outside of the protective apparatus 2 flows into the pattern area PA of the mask substrate 1, it is possible to further prevent the adhesion of foreign matter to the pattern area PA.

(3) Also, since the sheets 8A to 8D are made of the same material as the pellicle 5, fabrication is easy.

Note that when forming the pellicle 5 from a sheet that includes the areas between the rods 32A to 32D and mounting the pellicle 5 on the second frame 33, the areas between the rods 32A to 32D may be covered by the side portions of the pellicle 5. In this way, by integrally forming the sheets 8A to 8D and the pellicle 5, it is possible to simplify the fabrication process.

However, in the case of for example wanting to increase the light blocking effect between the rods 32A to 32D, opaque resin sheets, for example, may be used instead of the sheets 8A to 8D.

(4) Also, in the present embodiment, the four corner portions that include the rods 32A to 32D of the protective apparatus 2A are disposed in the vicinity of the fixed areas 26A, 26B of the mask substrate 1. Accordingly, since the height in the Z direction does not change, even if the mask substrate 1 sags at the portion between the rods 32A, 32D and the portion between the rods 32B, 32C, deformation is not exerted to the pellicle 5, and the flatness of the pellicle 5 is maintained at a high level.

Note that in the present embodiment, as shown by the dotted line in FIG. 5A, only the four portions 26C to 26F in the vicinity of the rods 32A to 32D of the pattern surface 1a of the mask substrate 1 may be adsorptively held in a conveying arm (not illustrated). In this case, although sag of the mask substrate 1 occurs under its own weight even between the rods 32A, 32B and the rods 32C, 32D (the side portions in the Y direction), since the first frame 31 sags at those portions in the Y direction), the flatness of the pellicle 5 is maintained at a high level, and it is possible to perform detection of foreign matter with a high degree of accuracy.

Figure 7A:
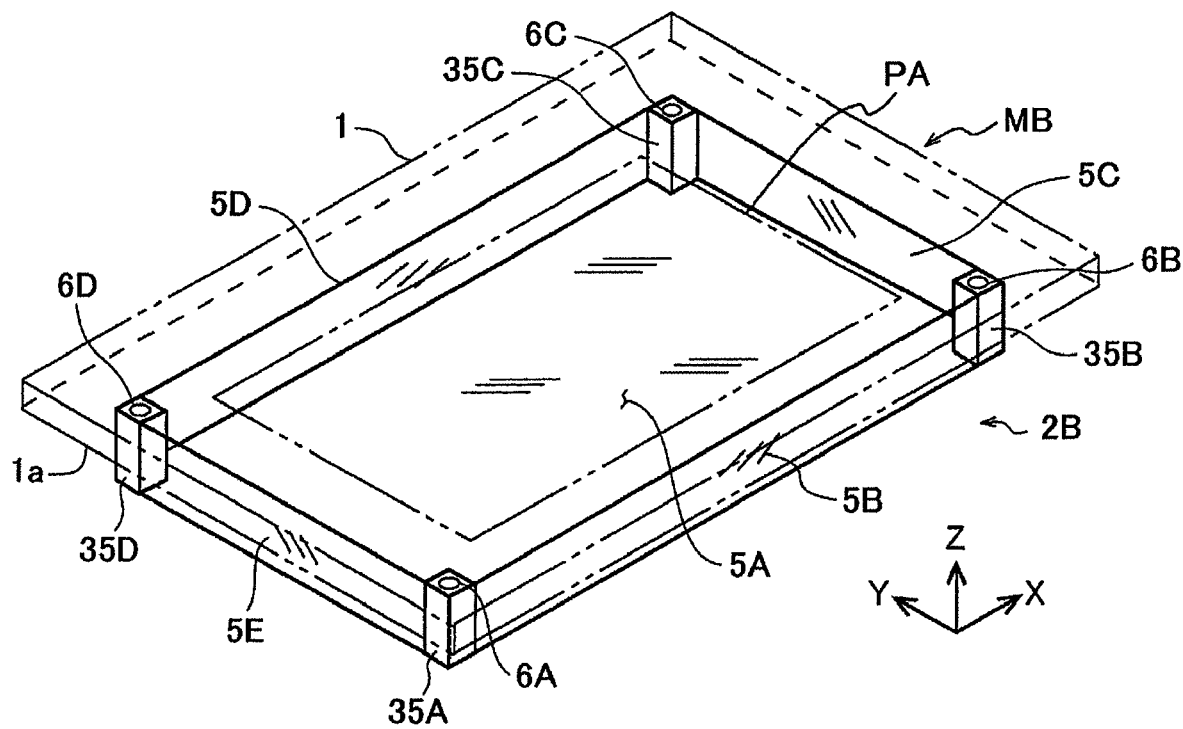
FIG. 7A is a drawing that shows a mask of a modification of the second embodiment, and is a perspective view that shows the mask.

Note that the protective apparatus 2A of the present embodiment is provided with the frames 31, 33, but as shown by a mask MB of the modification in FIG. 7A, the four rods 35A to 35D may be bonded to the pattern surface 1a of the mask substrate 1 via, for example, adhesive agents 6A to 6D. In FIG. 7A, the pellicle 5A is mounted on the opening portion of the rods 35A to 35D that opposes the pattern area PA (that is, the rectangular area in which the rods 35A to 35D serve as the four corner portions), and the openings of the side surfaces of the rods 35A to 35D (that is, the area sandwiched by two adjacent rods among the rods 35A to 35D) is made airtight. The material of the pellicle 5A is the same as the material of the pellicle 5 of FIG. 2A, and the sheets 5B to 5E are the same material as the pellicle 5A and integrally formed with the pellicle 5A. The protective apparatus 2B that covers the pattern area PA of the mask substrate 1 is constituted from the rods 35A to 35D, the sheets 5B to 5E, and the pellicle 5A.

Figure 7B:
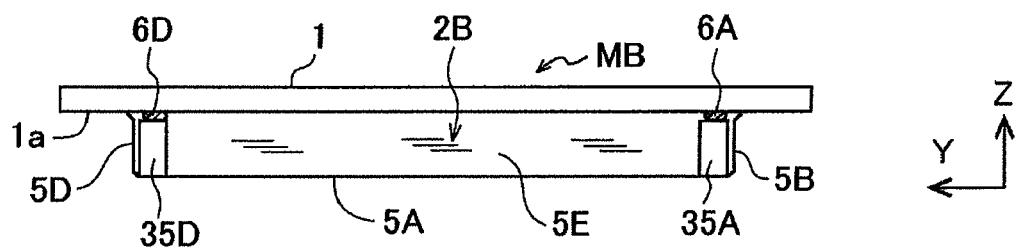
FIG. 7B is a side view that shows the mask.

In this case, as one example as shown in FIG. 7B that is a side view of the mask MB of FIG. 7A, the end portions of the sheets 5B, 5D (the same for the other sheets 5C, 5E) extend until the pattern surface 1a of the mask substrate 1, and thereby in addition to the airtightness being ensured, the circulation of gas between the inside and outside is possible to an extent. Note that the end portions of the sheets 5B to 5E may be brought into close contact with the mask substrate 1, and venting holes may be provided in the rods 35A to 35D.

Figure 7C:
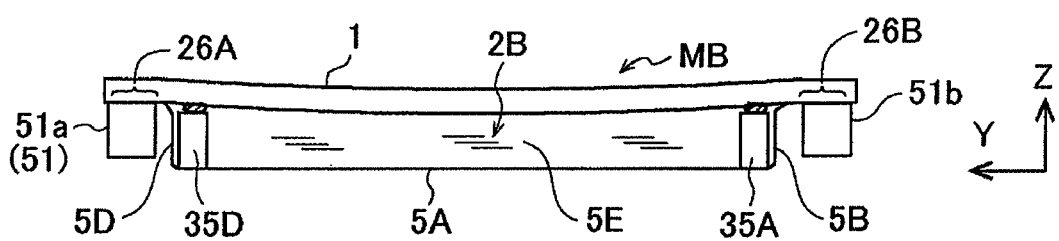
FIG. 7C is a side view that shows the mask during foreign matter detection.

During detection of foreign matter on the mask MB in this modification, as shown in FIG. 7C, the fixed areas 26A, 26B of the mask substrate 1 are supported by the holding portions 51a, 51b of the conveying arm 51. In this case, even if the mask substrate 1 sags in the −Z direction between the fixed areas 26A, 26B, slack only occurs in the sheets 5E and 5C, and slack is not exerted on the pellicle 5A, so the degree of flatness of the pellicle 5A is maintained at a high level. Accordingly, it is possible to detect foreign matter on the surface of the pellicle 5A with a high degree of accuracy.

Along with this mask MB having a simple constitution, in the case of supporting the mask substrate 1 at only the four locations in the vicinity of the rods 35A to 35D, the degree of flatness of the pellicle 5A is maintained at a high level. Also, it is possible to achieve a weight saving of the protective device 2B, and by extension a weight saving of mask MB.

In addition, the frame 33 of FIG. 5A may be fixed to the end portions of the rods 35A to 35D provided on the mask substrate 1, and the pellicle 5A may be mounted so as to cover the opening of the frame 33.

Also, the number of the rods 35A to 35D provided on the mask substrate 1 is not limited to four, and for example may be 2, 3, or 5 or more.

Also, the rods 35A to 35D may be fixed to the mask substrate 1 by optical contact or the like.

Also, by forming a predetermined pattern (such as a circuit pattern, electrode pattern) using the exposure apparatus EX of the embodiment described above, it is also possible to obtain many liquid crystal display elements that serve as microdevices (electronic devices). Hereinbelow, an example of this fabrication method shall be described with reference to the flowchart of FIG. 8.

Figure 8:
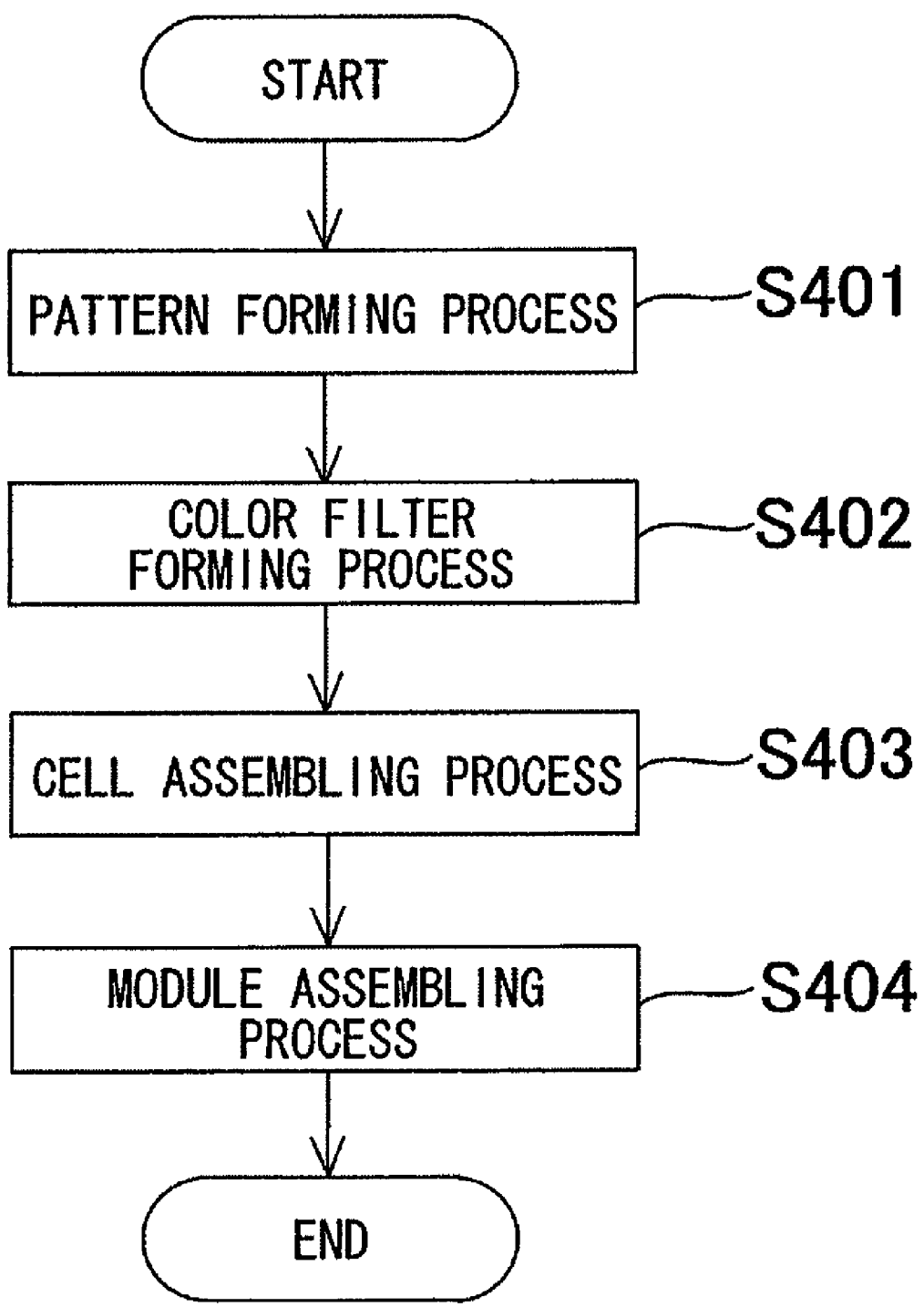
FIG. 8 is a flowchart that shows an example of the fabrication process of a liquid crystal display device.

In step S401 of FIG. 8 (pattern forming process), first a coating process that prepares a photosensitive substrate (plate P) by coating a substrate that serves as the exposure target with a photoresist, an exposure process that transfers the pattern of the mask for a liquid crystal display device onto the pattern forming areas of the photosensitive substrate, and a developing process that develops that photosensitive substrate are performed. In the lithography process that includes the coating process, the exposure process, and the developing process, a predetermined resist pattern is formed on the photosensitive substrate. Following this lithography process, passing through an etching process that has the resist pattern serve as a mask, and a resist stripping process, a predetermined pattern that includes a plurality of electrodes or the like is formed on the substrate. The lithography process is performed a plurality of times in accordance with the number of layers to be formed on the substrate.

In the following step S402 (color filter forming process), a color filter is formed wherein numerous groups of three fine filters corresponding to R (red), G (green), and B (blue) are arrayed in a matrix, or a plurality of groups of filters, each filter comprising three stripes (R, G, B), are arrayed in the horizontal scanning line directions. In the following step S403 (cell assembling process), a liquid crystal panel (liquid crystal cell) is fabricated by, for example, injecting liquid crystal between a substrate that has the predetermined pattern that was obtained in the step S401 and the color filter that was obtained in the step S402.

Subsequently, in the step S404 (module assembling process), the liquid crystal display device is completed by attaching various parts, such as a back light and an electrical circuit that operates the display of the liquid crystal panels (the liquid crystal cells) assembled in this way.

The method of fabricating liquid crystal display devices discussed above includes a process that exposes the pattern of a mask onto a photosensitive substrate using the exposure apparatus of the embodiments, and a process that performs processing by applying developing or the like of the photosensitive substrate that was exposed by that process.

Also, the fabrication method includes the transferring the pattern provided on the pattern area PA of the mask M or the like to the photosensitive substrate (object) of the above-described embodiments and processing the photosensitive substrate to which that pattern has been transferred. Also, processing the photosensitive substrate to which a pattern has been transferred includes performing processing on the photosensitive substrate based on the pattern that has been transferred, and as that processing, etching of the photosensitive substrate based on the transferred pattern, and printing the photosensitive substrate based on the transferred pattern (in other words, coating it with a predetermined material such as electrically conductive ink or the like based on the transferred pattern) can be applied.

At this time, since it is possible to perform detection of foreign matter on the pellicle with high precision even in the case of using a large mask, it is possible to fabricate devices with good throughput and with high precision.

Note that the present invention is not limited to a scanning exposure type exposure apparatus, and it is also possible to apply it to a mask of a full-field exposure type (stepper type) exposure apparatus.

Also, the present invention is not limited to a fabrication process for display devices such as a liquid-crystal display element that is formed on a square glass plate, an organic EL display, or a plasma display, but can also be widely applied to a fabrication process for various devices such as a semiconductor device, an imaging device (CCD etc.), a micro machine, MEMS (microelectromechanical system), a thin film magnetic head, a DNA chip, etc. Also, the present invention is not limited to a glass plate, and can also have for example a semiconductor wafer and a sheet-shaped substrate that has flexibility (for example a substrate in which the ratio of the thickness to the area is small compared to the glass plate and the semiconductor wafer) be the pohotosensitive substrate serving as the exposure target. Furthermore, the present invention can be applied to the fabrication process when fabricating a mask on which a mask pattern of various devices is formed (photomask, reticle and the like) using a photolithography process.

In this way, the present invention is not limited to the embodiments described above, and of course it is possible to obtain various constitutions within a scope that does not depart from the spirit of the invention.

What is claimed is:

1. A protective apparatus that protects a predetermined area of a front surface of a substrate, comprising:
    a support mechanism that is disposed on at least a portion of a circumference of the predetermined area and bonded to the front surface of the substrate; and
    a protective film that is mounted on the support mechanism so as to cover an opening portion that is formed by the support mechanism in a manner facing the predetermined area;
    wherein the support mechanism includes a plurality of first portions and second portions that are disposed at different positions along the predetermined area, and in relation to a normal direction of the front surface of the substrate, rigidity of the first portions is lower than rigidity of the second portions.

2. The protective apparatus according to claim 1, wherein the first portions include a resilient hinge mechanism that has flexibility in the normal direction.

3. The protective apparatus according to claim 2, wherein the resilient hinge mechanism includes a flat plate-shaped portion in which a depressed portion is provided substantially parallel to the front surface of the substrate.

4. The protective apparatus according to claim 2, wherein a cutaway portion is provided in a vicinity of the resilient hinge mechanism in the first portion.

5. The protective apparatus according to claim 1, wherein
    the plurality of second portions include a plurality of support columns that are disposed in a direction intersecting the front surface of the substrate;
    the first portions include at least a portion of an area between the plurality of support columns; and
    it is provided with a sealing member that seals the area between the plurality of support columns and in relation to the normal direction has lower rigidity than the second portions.

6. The protective apparatus according to claim 5, wherein the sealing member consists of the same material as the protective film and is integrally formed with the protective film.

7. The protective apparatus according to claim 1, wherein the plurality of second portions are disposed in a vicinity of supported portions where the substrate is supported among the front surface of the substrate.

8. The protective apparatus according to claim 1, wherein
    the plurality of second portions are disposed so as to sandwich the predetermined area in a first direction along the predetermined area, and
    the plurality of first portions are disposed so as to sandwich the predetermined area in a second direction that intersects the first direction at least along the predetermined area.

9. The protective apparatus according to claim 8, wherein
    the plurality of second portions are respectively disposed along the second direction on both sides of the first direction sandwiching the predetermined area; and
    the plurality of first portions are respectively disposed along the second direction on both sides in the second direction sandwiching the predetermined area.

10. The protective apparatus according to claim 8, wherein the plurality of second portions are disposed in a vicinity of both end portions in the second direction of at least the predetermined area, at both sides in the first direction sandwiching the predetermined area.

11. A mask comprising:
    a substrate in which a predetermined area is provided on a front surface; and
    the protective apparatus according to claim 1 that is provided on the front surface of the substrate so as to cover the predetermined area.

12. The mask according to claim 11, wherein the predetermined area includes a pattern area in which a pattern is formed.

13. A device fabrication method that includes transferring to an object the pattern that is provided on the mask recited in claim 12 and processing the object to which the pattern has been transferred.

14. The device fabrication method according to claim 13, wherein the processing of the object includes treating the object based on the pattern.

15. The device fabrication method according to claim 13, wherein the transferring of the pattern to the object includes projecting the image of the pattern on the object.

16. An exposure apparatus that exposes an object with exposure light via a mask and a projection optical system, using the mask according to claim 11 as the mask.

17. A mask fabricating method in which the protective apparatus of claim 1 is bonded to a front surface of a substrate so as to cover a predetermined area of the front surface of the substrate, the method comprising:
- placing a adhesive agent between the support mechanism of the protective apparatus and the front surface of the substrate; and
- pressing the support mechanism to the front surface of the substrate via the adhesive agent while supplementing rigidity of the first portions of the support mechanism.

18. The mask fabricating method according to claim 17, wherein:
- the first portions of the support mechanism include a flat plate-shaped portion in which a depressed portion is provided substantially parallel to the front surface of the substrate; and
- a spacer is disposed in the depressed portion in order to supplement the rigidity of the first portions.

19. The mask fabricating method according to claim 17, wherein a cutaway portion is provided in the first portion of the support mechanism, and
- the process that presses the protective apparatus to the front surface of the substrate includes providing a ventilation portion between the first portions and the front surface of the substrate via the cutaway portion in a portion of the first portions of the support mechanism.

20. A mask conveying apparatus comprising:
- a support portion that supports a mask in which the protective apparatus according to claim 1 is provided; and
- a drive apparatus that drives the support portion that supports the mask;
- wherein the support portion supports a portion in a vicinity of the second portion among the front surface of the substrate.

* * * * *